United States Patent
Hu et al.

(10) Patent No.: US 6,597,562 B1
(45) Date of Patent: Jul. 22, 2003

(54) ELECTRICALLY POLAR INTEGRATED CAPACITOR AND METHOD OF MAKING SAME

(75) Inventors: Man-Chun Hu, Taipei Hsien (TW); Jinn-Ann Kuo, Taipei Hsien (TW); Wen-Chung Lin, Taipei Hsien (TW)

(73) Assignee: Acer Laboratories, Inc., Taipei Hsien (TW)

( * ) Notice: Subject to any disclaimer, the term of this patent is extended or adjusted under 35 U.S.C. 154(b) by 0 days.

(21) Appl. No.: 10/065,043

(22) Filed: Sep. 13, 2002

(30) Foreign Application Priority Data

Jul. 11, 2002 (TW) ........................................ 091115471

(51) Int. Cl.[7] .............................................. H01G 4/228
(52) U.S. Cl. ................. 361/306.3; 361/306.1; 257/532
(58) Field of Search ............................. 361/306.3, 302, 361/306.1, 306.2, 309, 313; 257/532, 528, 303, 306

(56) References Cited

U.S. PATENT DOCUMENTS 5,208,725 A * 5/1993 Akcasu ....................... 361/313
6,037,621 A * 3/2000 Wilson ....................... 257/296
6,188,121 B1 * 2/2001 Baldi et al. ................. 257/532
6,385,033 B1 * 5/2002 Javanifard et al. ....... 361/306.2

* cited by examiner

Primary Examiner—Anthony Dinkins
(74) Attorney, Agent, or Firm—Winston Hsu

(57) ABSTRACT

An integrated capacitor includes a semiconductor substrate. A first vertical plate is laid over the semiconductor substrate. The first vertical plate consists of a plurality of first conductive slabs connected vertically using multiple first via plugs. A second vertical plate is laid over the semiconductor substrate in parallel with the first vertical plate. The second vertical plate consists of a plurality of second conductive slabs connected vertically using multiple second via plugs. A conductive plate is laid under the first vertical plate and second vertical plate over the semiconductor substrate for shielding the first vertical plate from producing a plate-to-substrate parasitic capacitance thereof. The second vertical plate is electrically connected with the conductive plate using a third via plug.

20 Claims, 5 Drawing Sheets

1

ELECTRICALLY POLAR INTEGRATED CAPACITOR AND METHOD OF MAKING SAME

BACKGROUND OF INVENTION

1. Field of the Invention

The present invention relates to an integrated capacitor, and more particularly, to an electrically polar integrated capacitor suited for analog/digital(A/D) converters, digital/analog(D/A) converters, or switch cap circuits.

2. Description of the Prior Art

Passive components such as capacitors are extensively used in integrated circuit (IC) design for radio-frequency (RF) and mixed-signal applications, such as filters, resonant circuits and bypassing. Due to trends toward higher-levels of integration to achieve reduction in cost associated with IC fabrication processes, the IC industry continually strives to economize each step of the fabrication process to the greatest extent possible.

FIG. 1 is a typical view fragmentarily illustrating a high capacitance density integrated capacitor according to the prior art. As shown in FIG. 1, the prior art integrated capacitor 1 consists of a plurality of parallel-arranged vertical metal plates 100 and 120. In FIG. 1, different shadings are used to distinguish the two terminals of the capacitor 1, where the vertical plates 120 are electrically connected to terminal A (or node A), and the vertical plates 100 are electrically connected to terminal B (or node B). The vertical metal plates 100 and 120 are fabricated on a semiconductor substrate (not explicitly shown). Each of the vertical metal plates 100 consists of a plurality of metal slabs 10a, 10b, 10c and 10d connected vertically using multiple via plugs 11a, 11b and 11c that are typically composed of metals. Each of the vertical metal plates 120 consists of a plurality of metal slabs 12a, 12b, 12c and 12d connected vertically using multiple via plugs 13a, 13b and 13c. The vertical plate 100 and the vertical plate 120 are isolated from each other by a dielectric layer (not shown). Generally, metal slabs 10a, 10b, 10c and 10d and metal slabs 12a, 12b, 12c and 12d of the prior art integrated capacitor 1 are fabricated in an interconnect process known in the art. Unlike the traditional metal-on-metal (MOM) capacitors as known to those skilled in the art, the prior art integrated capacitor 1 is fabricated without using extra photo-masks, thereby reducing production cost. Moreover, the prior art integrated capacitor 1 provides higher capacitance per unit area.

However, in operation, parasitic capacitance is produced at both node A and node B of the prior art integrated capacitor 1 between the vertical plate 120 and the substrate and between the vertical plate 100 and the substrate, hence rendering the prior art integrated capacitor 1 electrically non-polar. Please refer to FIG. 2 with reference to FIG. 1. FIG. 2 is an equivalent circuit diagram of the prior art integrated capacitor 1 as set forth in FIG. 1. As mentioned, the vertical plates 120 of the integrated capacitor 1 are electrically connected to the node A, and the vertical plates 100 of the integrated capacitor 1 are electrically connected to the node B. In operation, inter-plate capacitance $C_{in}$, parasitic capacitance $C_A$, and parasitic capacitance $C_B$ are generated between node A and node B. The parasitic capacitance $C_A$ is induced between lowest metal slab 10a of the vertical metal plate 100 and the electrically grounded semiconductor substrate. The parasitic capacitance $C_B$ is induced between lowest metal slab 12a of the vertical metal plate 120 and the electrically grounded semiconductor substrate. Due to the non-polar property presented by the prior art integrated capacitor 1, the prior art integrated capacitor 1 is therefore not suited for the design of analog/digital(A/D) converters, digital/analog (D/A) converters, or switch cap circuits.

SUMMARY OF INVENTION

Accordingly, the primary objective of the claimed invention is to provide an electrically polar integrated capacitor with a high capacitance density that is suited for analog/digital(A/D) converters, digital/analog(D/A) converters, or switch cap circuits.

According to one preferred embodiment of this invention, an integrated capacitor having an electrically polar property is disclosed. The integrated capacitor comprises a semiconductor substrate. A first vertical plate is laid over the semiconductor substrate. The first vertical plate consists of a plurality of first conductive slabs connected vertically using multiple first via plugs. A second vertical plate is laid over the semiconductor substrate in parallel with the first vertical plate. The second vertical plate consists of a plurality of second conductive slabs connected vertically using multiple second via plugs. A conductive plate is laid under the first vertical plate and second vertical plate over the semiconductor substrate for shielding the first vertical plate from producing a plate-to-substrate parasitic capacitance thereof. The second vertical plate is electrically connected with the conductive plate using a third via plug.

According to another preferred embodiment of this invention, an integrated capacitor having an electrically polar property is disclosed. The integrated capacitor comprises a semiconductor substrate and a first vertical capacitor bar laid over the semiconductor substrate. The first vertical capacitor bar consists of a plurality of first conductive squares connected vertically using multiple first via plugs. A second vertical capacitor bar is laid over the semiconductor substrate in parallel with the first vertical capacitor bar. The second vertical capacitor bar consists of a plurality of second conductive squares connected vertically using multiple second via plugs. A parallel conductive plate is laid under the first vertical capacitor bar and second vertical capacitor bar over the semiconductor substrate for shielding the first vertical capacitor bar from producing a plate-to-substrate parasitic capacitance thereof. The second vertical capacitor bar is electrically connected with the parallel conductive plate using a third via plug.

The foregoing has outlined, rather broadly, preferred and alternative features of the claimed invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the claimed invention. Those skilled in the art should also realize that such equivalent constructions do not depart from the spirit and scope of the invention in its broadest form.

DETAILED DESCRIPTION

Figure 1:
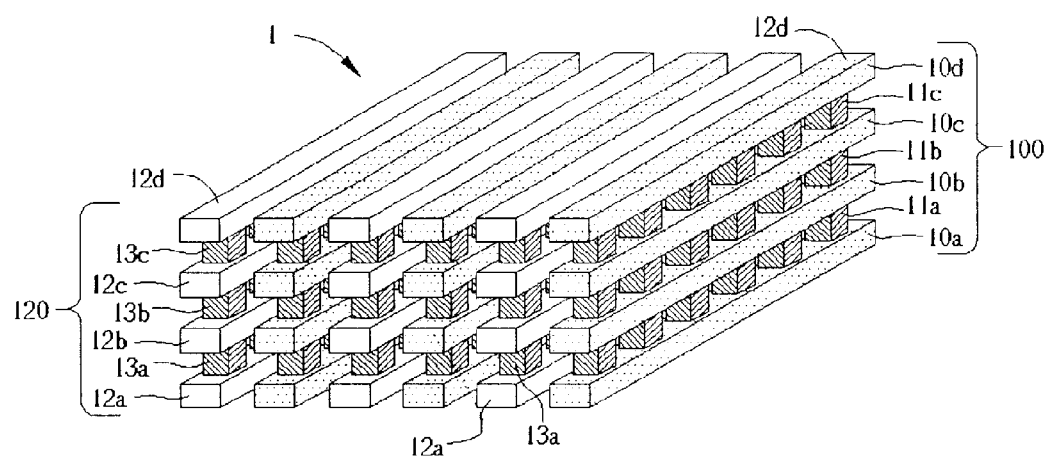
FIG. 1 is an enlarged typical view fragmentarily illustrating a high-density integrated capacitor structure according to the prior art.
Figure 2:
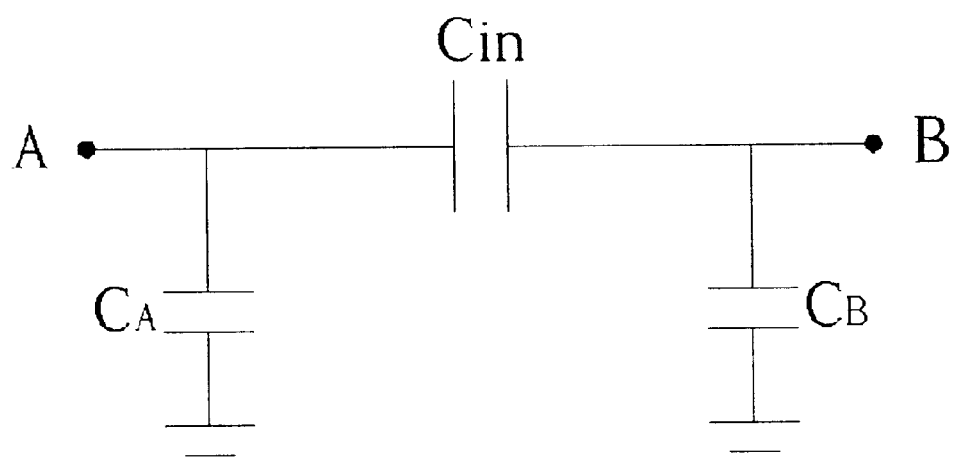
FIG. 2 is an equivalent circuit diagram of the prior art integrated capacitor as set forth in FIG. 1.
Figure 3:
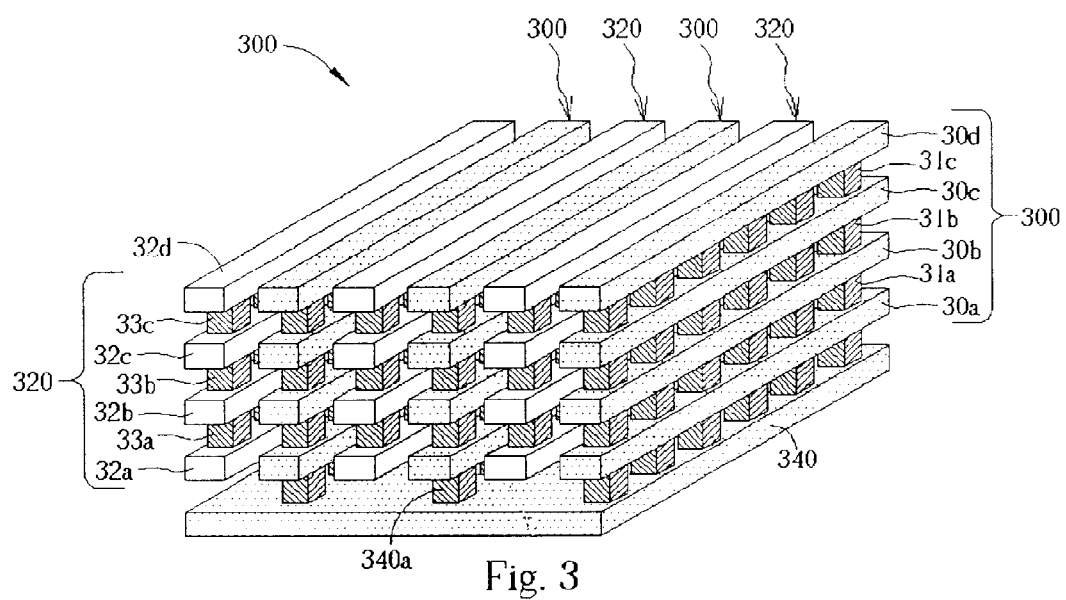
FIG. 3 is an enlarged perspective view fragmentarily illustrating a high capacitance density integrated capacitor according to the present invention.

Please refer to FIG. 3. FIG. 3 is a perspective view fragmentarily illustrating a high capacitance density integrated capacitor according to the present invention. As shown in FIG. 3, the integrated capacitor 3 consists of a plurality of parallel-arranged vertical metal plates 300 and 320. In FIG. 3, likewise, different shadings are used to distinguish the two terminals of the capacitor 3, where the vertical plates 320 are electrically connected to terminal A (or node A), and the vertical plates 300 are electrically connected to terminal B (or node B). The vertical metal plates 300 and 320 are fabricated on a semiconductor substrate (not explicitly shown). Each of the vertical metal plates 300 consists of a plurality of metal slabs 30a, 30b, 30c and 30d connected vertically using multiple via plugs 31a, 31b and 31c that are typically composed of metals. Each of the vertical metal plates 320 consists of a plurality of metal slabs 32a, 32b, 32c and 32d connected vertically using multiple via plugs 33a, 33b and 33c. The vertical plate 300 and the vertical plate 320 are isolated from each other by a dielectric layer (not shown). According to this invention, metal slabs 30a, 30b, 30c and 30d and metal slabs 32a, 32b, 32c and 32d of the integrated capacitor 3 are fabricated in an interconnect process known in the art. Since the integrated capacitor 3 is fabricated without using extra photo-masks, production cost is reduced.

Still referring to FIG. 3, the integrated capacitor 3 of this invention further comprises a parallel conductive plate 340 laid between the underlying semiconductor substrate (not explicitly shown) and the overlying integrated vertical metal plates 300 and 320. The parallel conductive plate 340 is electrically connected with the vertical metal plates 300 using a via plug 340a. The parallel conductive plate 340 is electrically isolated from the vertical metal plates 320 using a dielectric layer (not shown). The parallel conductive plate 340 is made of conductive materials such as metals or polysilicon. According to the preferred embodiment of the present invention, the conductive plate 340 is defined with the first layer metal (metal 1) in the interconnection process of the integrated circuit.

Figure 4:
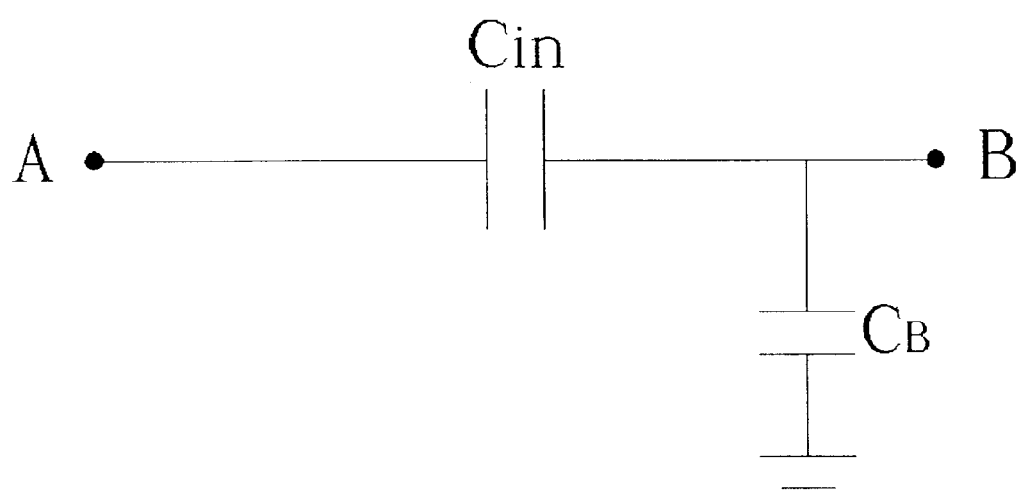
FIG. 4 is an equivalent circuit diagram of the integrated capacitor as set forth in FIG. 3.

Please refer to FIG. 4. FIG. 4 is an equivalent circuit diagram of the integrated capacitor 3 as set forth in FIG. 3. The vertical plates 320 of the integrated capacitor 3 are electrically connected to the node A, and the vertical plates 300 of the integrated capacitor 3 are electrically connected to the node B. In operation, inter-plate capacitance $C_{in}$ and parasitic capacitance $C_B$ are generated between node A and node B. The parasitic capacitance $C_B$ is induced between the vertical metal plate 320 and the electrically grounded semiconductor substrate. It is noteworthy that there is no parasitic capacitance produced at node A due to the shielding of the parallel conductive plate 340. Since the integrated capacitor 3 has a polar property, it is suited for the design of analog/digital(A/D) converters, digital/analog(D/A) converters, or switch cap circuits.

Figure 5:
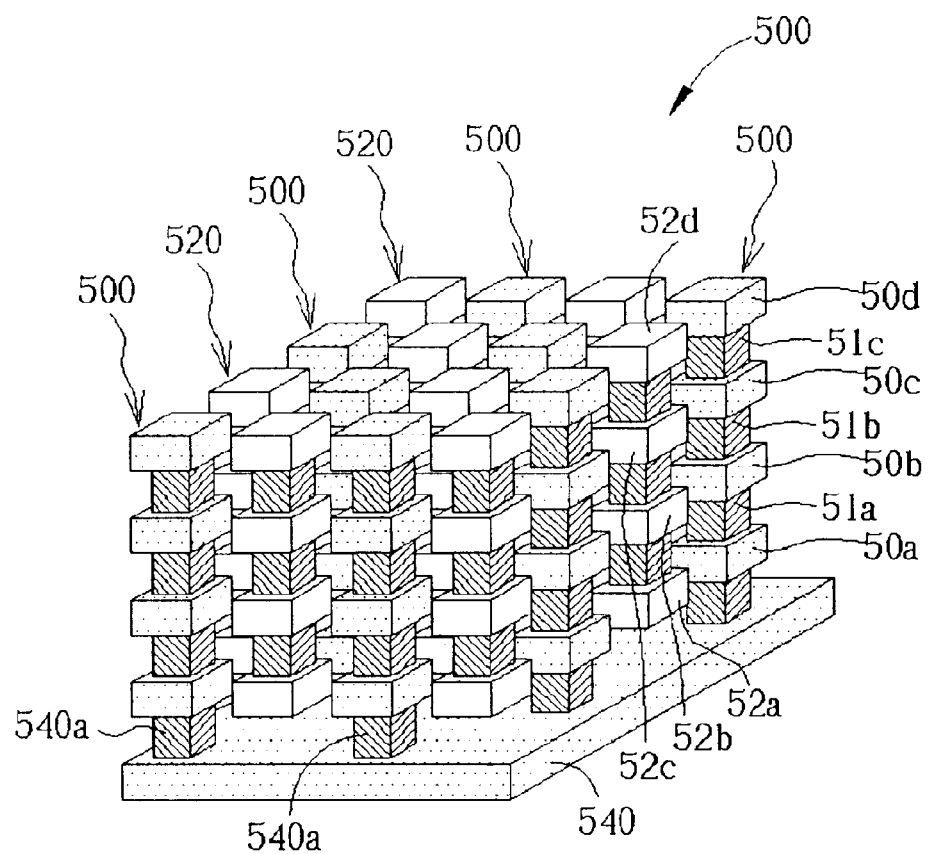
FIG. 5 is a perspective view of the integrated capacitor structure according to another preferred embodiment of this invention.

Please refer to FIG. 5. FIG. 5 is a perspective view of the capacitor structure according to another preferred embodiment of this invention. As shown in FIG. 5, the integrated capacitor 5 consists of a plurality of parallel-arranged vertical capacitor bars or electrode bars 500 and 520. In FIG. 5, likewise, different shadings are used to distinguish the two terminals of the capacitor 5, where the vertical capacitor bars 520 are electrically connected to terminal A (or node A), and the vertical capacitor bars 500 are electrically connected to terminal B (or node B). The vertical capacitor bars 500 and 520 are fabricated on a semiconductor substrate (not explicitly shown). Each of the vertical capacitor bars 500 consists of a plurality of metal squares 50a, 50b, 50c and 50d connected vertically using multiple via plugs 51a, 51b and 51c that are typically composed of metals. Each of the vertical capacitor bars 520 consists of a plurality of metal slabs 52a, 52b, 52c and 52d connected vertically using multiple via plugs. The vertical plate 500 and the vertical plate 520 are isolated from each other by a dielectric layer (not shown). According to this invention, metal squares 50a, 50b, 50c and 50d and metal squares 52a, 52b, 52c and 52d of the integrated capacitor 5 are fabricated in an interconnect process known in the art. Since the integrated capacitor 5 is fabricated without using extra photo-masks, production cost is reduced.

The integrated capacitor 5 further comprises a parallel conductive plate 540 laid between the underlying semiconductor substrate (not explicitly shown) and the overlying integrated vertical capacitor bars 500 and 520. The parallel conductive plate 540 is electrically connected with the vertical capacitor bars 500 using a via plug 540a. The parallel conductive plate 540 is electrically isolated from the vertical capacitor bars 520 using a dielectric layer (not shown). The parallel conductive plate 540 is made of conductive materials such as metals or polysilicon. According to the preferred embodiment of the present invention, the conductive plate 540 is defined with the first layer metal (metal 1) in the interconnection process of the integrated circuit.

Further, this invention also discloses a method of forming an integrated capacitor. The method comprises the following steps:

a. providing a semiconductor substrate comprising a first vertical plate consisting of a plurality of first conductive slabs connected vertically using multiple first via plugs, and a second vertical plate consisting of a plurality of second conductive slabs connected vertically using multiple second via plugs;

b. providing a conductive plate under the first vertical plate and the second vertical plate on the semiconductor substrate for shielding the first vertical plate from producing a plate-to-substrate parasitic capacitance thereof; and c. electrically connecting the second vertical plate with the conductive plate using a third via plug.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An integrated capacitor, comprising:
    a semiconductor substrate;
    a first vertical plate laid over the semiconductor substrate, the first vertical plate consisting of a plurality of first conductive slabs connected vertically using multiple first via plugs;
    a second vertical plate laid over the semiconductor substrate in parallel with the first vertical plate, the second vertical plate consisting of a plurality of second conductive slabs connected vertically using multiple second via plugs; and a conductive plate laid under the first vertical plate and second vertical plate over the semiconductor substrate for shielding the first vertical plate from producing a plate-to-substrate parasitic capacitance thereof;

wherein the second vertical plate is electrically connected with the conductive plate using a third via plug.

2. The integrated capacitor of claim 1 wherein the conductive plate is floating and is made of metal.

3. The integrated capacitor of claim 1 wherein the conductive plate and the overlaying first vertical plate are isolated from each other by at least one layer of dielectric material.

4. The integrated capacitor of claim 1 wherein the first and second vertical plates are electrically isolated from each other.

5. The integrated capacitor of claim 1 wherein when the first vertical plate is electrically connected to a node A, the second vertical plate is electrically connected to a node B, and the semiconductor substrate is grounded, the plate-to-substrate parasitic capacitance is produced at the node B.

6. The integrated capacitor of claim 1 wherein when the first vertical plate is electrically connected to a node A, the second vertical plate is electrically connected to a node B, and the semiconductor substrate is grounded, there is no plate-to-substrate parasitic capacitance produced at the node A.

7. An integrated capacitor, comprising:

a semiconductor substrate;

a first vertical capacitor bar laid over the semiconductor substrate, the first vertical capacitor bar consisting of a plurality of first conductive squares connected vertically using multiple first via plugs;

a second vertical capacitor bar laid over the semiconductor substrate in parallel with the first vertical capacitor bar, the second vertical capacitor bar consisting of a plurality of second conductive squares connected vertically using multiple second via plugs; and a parallel conductive plate laid under the first vertical capacitor bar and second vertical capacitor bar over the semiconductor substrate for shielding the first vertical capacitor bar from producing a plate-to-substrate parasitic capacitance thereof;

wherein the second vertical capacitor bar is electrically connected with the parallel conductive plate using a third via plug.

8. The integrated capacitor of claim 7 wherein the parallel conductive plate and the overlaying first vertical capacitor bar are isolated from each other by at least one layer of dielectric material.

9. The integrated capacitor of claim 7 wherein the first and second conductive squares are composed of metal.

10. The integrated capacitor of claim 7 wherein the first and second vertical capacitor bars are electrically isolated from each other.

11. The integrated capacitor of claim 7 wherein when the first vertical capacitor bar is electrically connected to a node A, the second vertical capacitor bar is electrically connected to a node B, and the semiconductor substrate is grounded, the plate-to-substrate parasitic capacitance is produced at the node B.

12. The integrated capacitor of claim 7 wherein when the first vertical capacitor bar is electrically connected to a node A, the second vertical capacitor bar is electrically connected to a node B, and the semiconductor substrate is grounded, there is no plate-to-substrate parasitic capacitance produced at the node A.

13. A method of forming an integrated capacitor, comprising:

providing a semiconductor substrate comprising a first vertical plate consisting of a plurality of first conductive slabs connected vertically using multiple first via plugs, and a second vertical plate consisting of a plurality of second conductive slabs connected vertically using multiple second via plugs;

providing a conductive plate under the first vertical plate and the second vertical plate on the semiconductor substrate for shielding the first vertical plate from producing a plate-to-substrate parasitic capacitance thereof; and electrically connecting the second vertical plate with the conductive plate using a third via plug.

14. The method of claim 13 wherein the conductive plate and the overlaying first vertical plate are isolated from each other by at least one layer of dielectric material.

15. The method of claim 13 wherein when the first vertical plate is electrically connected to a node A, the second vertical plate is electrically connected to a node B, and the semiconductor substrate is grounded, the plate-to-substrate parasitic capacitance is produced at the node B.

16. The method of claim 13 wherein when the first vertical plate is electrically connected to a node A, the second vertical plate is electrically connected to a node B, and the semiconductor substrate is grounded, there is no plate-to-substrate parasitic capacitance produced at the node A.

17. A method of forming an electrically polar integrated capacitor, comprising:

providing a semiconductor substrate;

providing a conductive plate on the semiconductor substrate, wherein the conductive plate is electrically isolated from the semiconductor substrate;

providing a plurality of first capacitor members and second capacitor members over the conductive plate, wherein the plurality of first capacitor members are arranged in parallel with the second capacitor members to form an integrated capacitor;

electrically isolating the plurality of first capacitor members from the underlying conductive plate; and electrically connecting the second capacitor members with the underlying conductive plate.

18. The method of claim 17 wherein each of the plurality of first or second capacitor members is a vertical plate consisting of a plurality of conductive slabs connected vertically using multiple via plugs.

19. The method of claim 17 wherein each of the plurality of first or second capacitor members is a vertical capacitor bar consisting of a plurality of conductive squares connected vertically using multiple via plugs.

20. The method of claim 17 wherein the plurality of first or second capacitor members are arranged into an interlacing capacitor structure.

* * * * *